US008836375B2

(12) United States Patent
Ghatak

(10) Patent No.: US 8,836,375 B2
(45) Date of Patent: Sep. 16, 2014

(54) CONTINUOUSLY SELF-CALIBRATED LATCHED COMPARATOR

(75) Inventor: Kalyan Brata Ghatak, San Jose, CA (US)

(73) Assignee: LSI Corporation, San Jose, CA (US)

(*) Notice: Subject to any disclaimer, the term of this patent is extended or adjusted under 35 U.S.C. 154(b) by 7 days.

(21) Appl. No.: 13/604,946

(22) Filed: Sep. 6, 2012

(65) Prior Publication Data
US 2014/0062569 A1 Mar. 6, 2014

(51) Int. Cl.
H03K 5/22 (2006.01)

(52) U.S. Cl.
USPC .......................................................... 327/65

(58) Field of Classification Search
USPC ............................................. 327/63, 65, 67
See application file for complete search history.

(56) References Cited

U.S. PATENT DOCUMENTS

| 6,144,231 | A | 11/2000 | Goldblatt |
| 6,333,647 | B1 | 12/2001 | Plagens |
| 7,064,595 | B2 * | 6/2006 | Sharma et al. ............... 327/205 |
| 7,352,215 | B2 | 4/2008 | Bult et al. |
| 7,501,862 | B2 | 3/2009 | Su et al. |
| 7,965,217 | B2 | 6/2011 | Murden et al. |
| 8,030,972 | B2 | 10/2011 | Jansson |
| 8,362,934 | B2 * | 1/2013 | Matsuzawa et al. ......... 341/118 |
| 2004/0124887 | A1 * | 7/2004 | Schaefer et al. ............. 327/65 |
| 2011/0115529 | A1 | 5/2011 | Jansson |
| 2011/0309961 | A1 | 12/2011 | Danjo |

FOREIGN PATENT DOCUMENTS

DE 102006004212 A1 * 8/2007
WO WO 2010050515 A1 * 5/2010

OTHER PUBLICATIONS

Jeon, H. et al. "Offset Voltage Analysis of Dynamic Comparator," 2011 54th International Midwest Symposium on Circuits and Systems, Aug. 7-10, 2011, 4 pages.
Naga Sudha, N. et al., "High Speed and Lower Power Dynamic Latched Comparator for Air Craft Application," International Journal of Engineering Research and Applications (IJERA) (2012) 2(3):1301-1312, May-June.
Nema, M. et al., "Design of Low-Offset Voltage Dynamic Latched Comparator," IOSR Journal of Engineering (2012) 2(4):585-590, April.
Parida, D., "A Novel High Speed CMOS Comparator with Low Power Disipation and Low Offset," A Thesis Submitted in Partial Fulfillment of the Requirements for the Degree of Master of Technology in VLSI Design & Embedded System (2010) Department of Electronics & Communication Engineering, National Institute of Technology, Rourkela, 72 pages.

* cited by examiner

Primary Examiner — Quan Tra
(74) Attorney, Agent, or Firm — Kermit D. Lopez; Luis M. Ortiz; Ortiz & Lopez, PLLC

(57) ABSTRACT

A comparator apparatus includes an amplifier and one or more latched comparators connected to the amplifier that compares input voltage signals to predefined reference voltage signals. The comparator apparatus includes an offset that limits the minimum input differential voltage signal with respect to the predefined voltage signals. A calibration component is electrically connected to the latched comparator and assists in continuously measuring and compensating the offset.

16 Claims, 7 Drawing Sheets

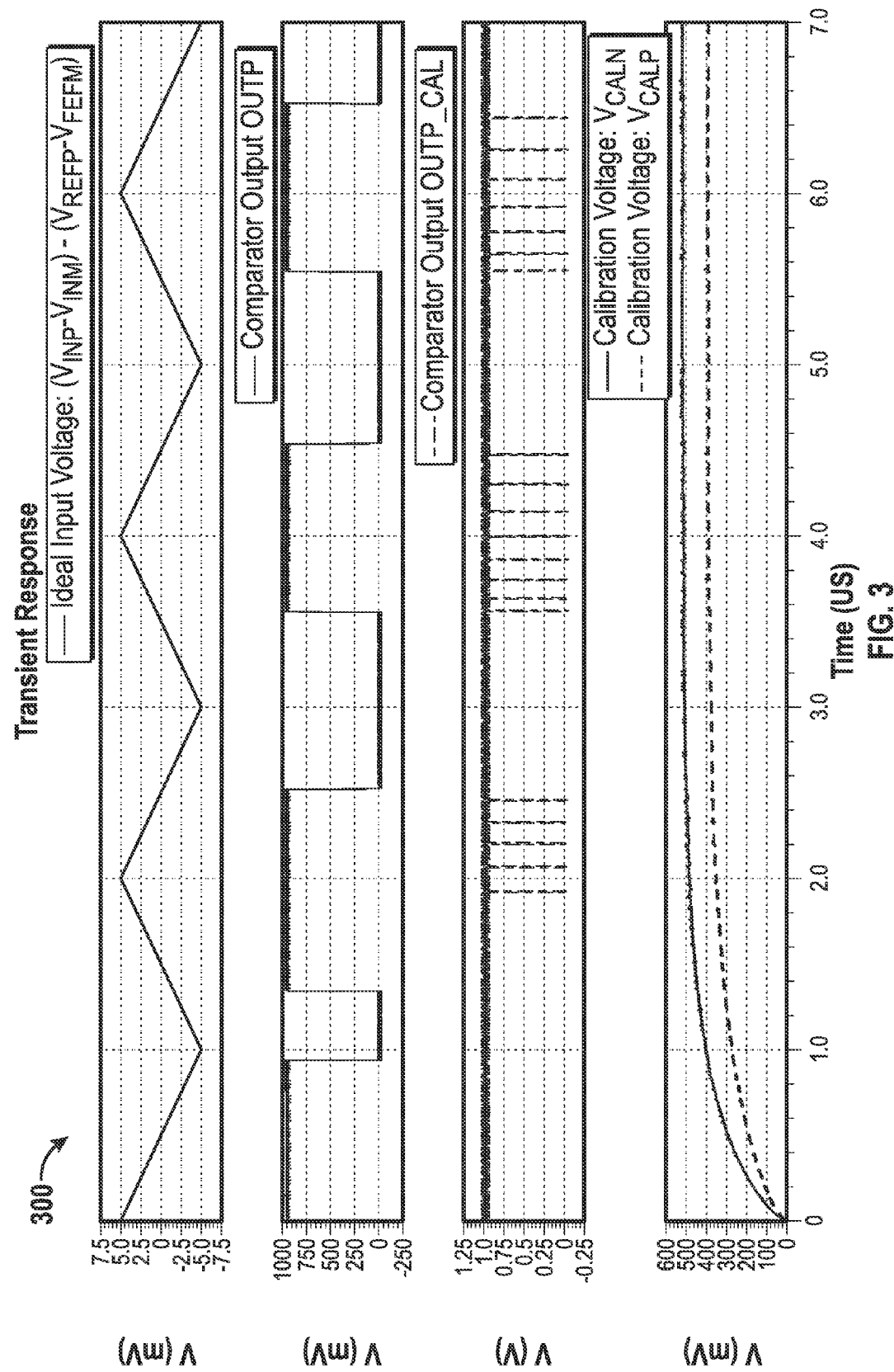

CONTINUOUSLY SELF-CALIBRATED LATCHED COMPARATOR

TECHNICAL FIELD

Embodiments are generally related to ADC (Analog-to-Digital Converter) circuits and components. Embodiments are also related to dynamic preamplifiers and latched comparator circuits.

BACKGROUND OF THE INVENTION

Latched comparators are employed in ADC applications to compare an input voltage signal to a reference voltage signal. Such comparators typically possess large offsets usually as a result of a combination of threshold voltage mismatch that arises from the use of small transistor sizes to meet operating speed requirements and the on and off switching of various transistors. These offsets can limit the minimum difference between the input data signal and the reference signal that the comparator can detect, thereby limiting the accuracy of the ADC. Existing offset calibration approaches require a dedicated calibration phase when the comparator goes offline and cannot be used for data conversion operations.

Many ADCs use dynamic preamplifiers in their latched comparators because they do not consume static power. Comparators that employ dynamic preamplifiers function generally operate on the principle that a difference in input voltages causes a difference in charging/discharging currents when the dynamic preamplifier is switched on. The difference in these currents can lead to unequal charging and discharging times at cross-coupled nodes whereby one node pulls high with respect to a higher power supply and the other pulls low with respect to a lower power supply, thereby enabling the comparator to make a decision.

If the comparator has an offset, then a non-zero differential input voltage can still lead to unequal currents being produced when the latch is enabled. As will be explained in greater detail herein, if an external current is introduced into the comparator to counter the effect of this residual current, the effect of the input-referred offset can be mitigated.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for an improved comparator apparatus.

It is another aspect of the disclosed embodiments to provide for an improved apparatus and method for continuously calibrating the offset of a comparator, where the comparator does not have to be taken offline during the calibration process.

It is a further aspect of the disclosed embodiments to provide for a calibration process that is able to detect drifts in the offset voltage due to changes in operating temperature or power supply and can immediately calibrate the change in offset.

The aforementioned aspects and other objectives and advantages can now be achieved as described herein. A comparator apparatus includes a preamplifier and one or more cross-coupled latches connected to the preamplifier to compare input voltage signals to predefined reference voltage signals. An offset can limit the minimum input differential voltage signal that the comparator is able to detect with respect to the predefined voltage signals. A calibration component is electrically connected to the latched comparator and preamplifier, and assists in measuring and compensating the offset in order to calibrate changes in the offset that arise due to electrical variations thereof.

The comparator apparatus can further employ a delay latch to store the comparator's decision after sampling the common reference voltages and the input offset during the reset phase. This decision can be utilized for calibration during the next reset phase. This approach ensures that the capacitor voltages have settled before the comparison phase begins when the comparator shall start to sample and evaluate the actual input signal voltage. In some embodiments, the comparator apparatus can also include two charge pumps to determine the optimum calibration capacitor voltages on either branch of the preamplifier. Additionally, a cascode transistor can be employed in some embodiments by the calibration apparatus to shield the calibration capacitor voltage from the preamplifier's switching nodes.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

FIG. 3 illustrates a graph depicting clocking voltage/signals in a self-calibrated comparator in a self-calibrated comparator including transient response data thereof, in accordance with the disclosed embodiments.

DETAILED DESCRIPTION

The particular values and configurations discussed in these non-limiting examples can be varied and are cited merely to illustrate at least one embodiment and are not intended to limit the scope thereof.

Figure 1A:
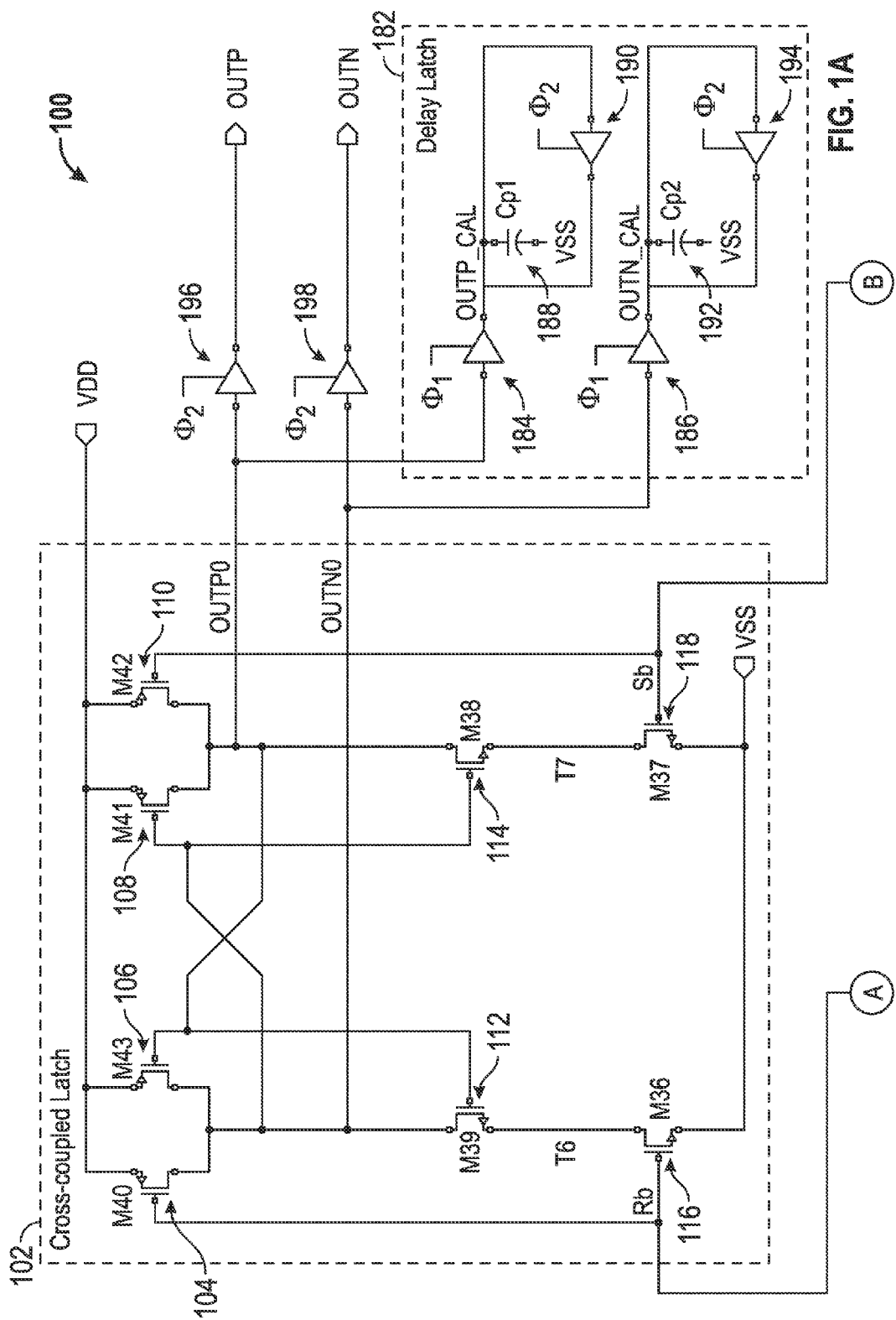
FIG. 1A illustrates a schematic diagram of a cross-coupled latch and a delay latch that form a part of a continuously self-calibrated comparator, in accordance with the disclosed embodiments.

FIG. 1A illustrates a schematic diagram of a cross-coupled latch circuit 102 and a delay latch circuit 182 that form a part of a continuously self-calibrated comparator 100, in accordance with the disclosed embodiments. In general, the cross-coupled latch circuit 102 includes a transistor 104 that is electrically connected to a transistor 106 and a transistor 112. The input to the transistor 104 is also electrically connected to an input to a transistor 116 that in turn is electrically connected to a transistor 112 and a transistor 118. A transistor 114 is electrically connected to the transistor 118 and to a transistor 108 and a transistor 110. Transistors 106 and 112 are thus cross-coupled with transistors 108 and 114. Transistors 104, 106, 108, and 110 are also connected to a voltage supply VDD.

Note that an electrical output OUTPO is electrically connected to the inputs of digital buffers 196 and 184 and also to transistors 108, 110, and 114. Similarly, an electrical output OUTN0 is electrically connected to the inputs of digital buffers 198 and 186 and also to transistors 104, 106, and 112. Output from digital buffer 196 is indicated by OUTP and the output of digital buffer 198 is indicated by OUTN. One or more dock signals $\phi_2$ can also be provided to each of the digital buffers 196 and 198 so that digital buffers 196 and 198 operate only when the dock signal $\phi_2$ rises to a "high" value.

The delay latch circuit 182 generally includes digital buffers 184 and 186. The digital buffer 184 provides an electrical output that is electrically connected to a capacitor 188 and the electrical output of a digital buffer 190. The electrical output of digital buffer 186 is electrically connected to a capacitor 192 and to the output of a digital buffer 194. Additionally, one or more clock signals $\phi_1$ are also shown in FIG. 1A, wherein dock signal $\phi_1$ is provided to digital buffer 184 and also to digital buffer 186 such that these buffers operate only when the clock signal $\phi_1$ rises to a "high" value.

Figure 1B:
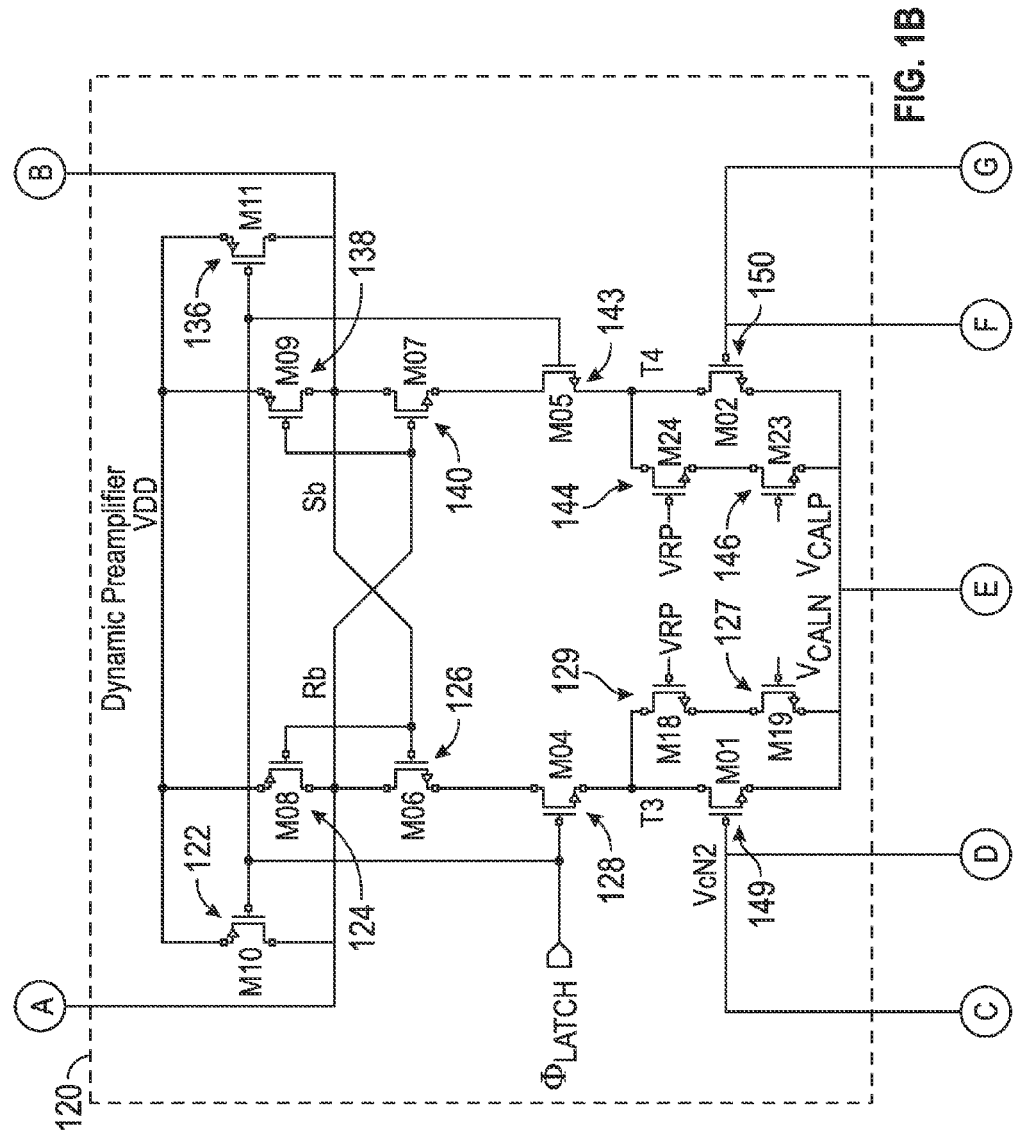
FIG. 1B illustrates a schematic diagram of a dynamic preamplifier that forms a part of a continuously self-calibrated comparator, in accordance with the disclosed embodiments.

FIG. 1B illustrates a schematic diagram of a dynamic preamplifier 120 that forms a part of the overall continuously self-calibrated comparator 100, in accordance with the disclosed embodiments. Note that the circuits shown in FIG. 1A are electrically connected to the dynamic preamplifier 120 as indicated at nodes A and B. Similarly nodes C, D, E, F, and G indicate electrical connections to the components, circuits, and so forth shown in FIG. 1C, etc. Thus, the dynamic preamplifier 120 depicted in FIG. 1B includes a transistor 122 that is electrically connected to transistors 124, 126, 140, 138, 136. The transistor 126 is further connected to a transistor 128, which in turn is connected to a transistor 129, and a transistor 149. The transistor 149 is connected further to a transistor 127. The transistors 127 and 129 are thus electrically in series with one another and together in parallel with the transistor 149.

Figure 1C:
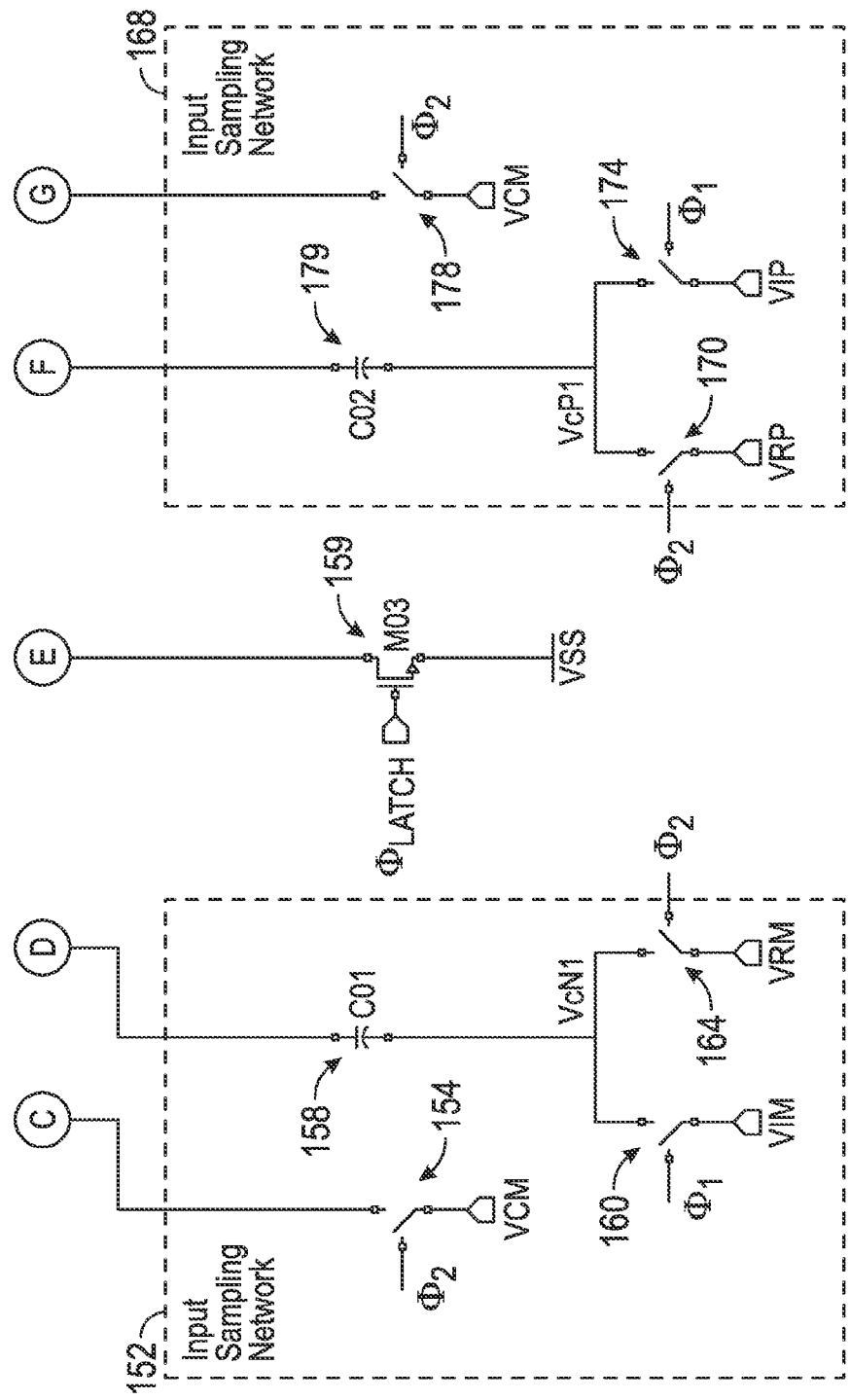
FIG. 1C illustrates a schematic diagram of two input sampling networks that form a part of a continuously self-calibrated comparator, in accordance with the disclosed embodiments.

Transistor 127 is further connected to a transistor 146, which in turn is connected in series with a transistor 144. The transistors 144 and 146 are in parallel with a transistor 150. Transistor 140 and transistor 150 are connected to transistor 143. Transistor 150 and transistor 143 are connected to transistor 144 at the point or node T4 shown in FIG. 1B. The transistor 140 is connected to transistor 138 and transistors 124, 126, and 122. As a reminder, electrical connections/continuations to the circuit shown in FIG. 1C are indicated by nodes C, D, E, F, and G. Transistors 122, 124, and 136, 138 are also connected to voltage VDD.

FIG. 1C illustrates a schematic diagram of two input sampling networks 152 and 168 that form a part of a continuously self-calibrated comparator 100, in accordance with the disclosed embodiments. In general, the input sampling network 152 includes a switch 154 that can connect to a node VCM and also clock signal $\phi_2$ and to transistor 149 and capacitor 158 via respective connecting nodes C and D. The input sampling network 152 further includes a switch 160 that can connect to the clock signal $\phi_1$ and to another switch 164. The switch 160 can further connect to a node VIM and the switch 164 can connect to a node VRM and the dock signal $\phi_2$. Switches 160 and 164 together can connect to the capacitor 158 (also labeled as C01 in FIG. 1C) at a node or point VcN1. Note that the transistors 149, 127, 146, and 150, shown in FIG. 1B, connect via connecting node E to a transistor 159 that is also connected to the signal $\Phi_{LATCH}$ as shown in FIG. 1C. Note that in FIG. 1C, latch 159 is depicted between the input sampling network 152 and the input sampling network 168, and is shown as connected via node E to the aforementioned components depicted in FIG. 1B.

The input sampling network 168 includes a capacitor 179 that can connect to switches 170 and 174. The input sampling network 168 further includes a switch 178 that connects via connecting node G to the input of the transistor 150 shown in FIG. 1B. Similarly, the capacitor 179 (also labeled C02 in FIG. 1C) can connect to the input of transistor 150 shown in FIG. 1B via the connecting node F. The switch 170 can connect to a clock signal $\phi_2$ and a node VRP. The switch 174 can connect to the clock signal $\phi_1$ and a node VIP. Switches 170 and 174 can further connect together at a node VcP1 to the capacitor 179. The switch 178 can connect to a clock signal $\phi_2$ and a node VCM and further to the connected node C and the input to the transistor 150 as indicated above.

Figure 1D:
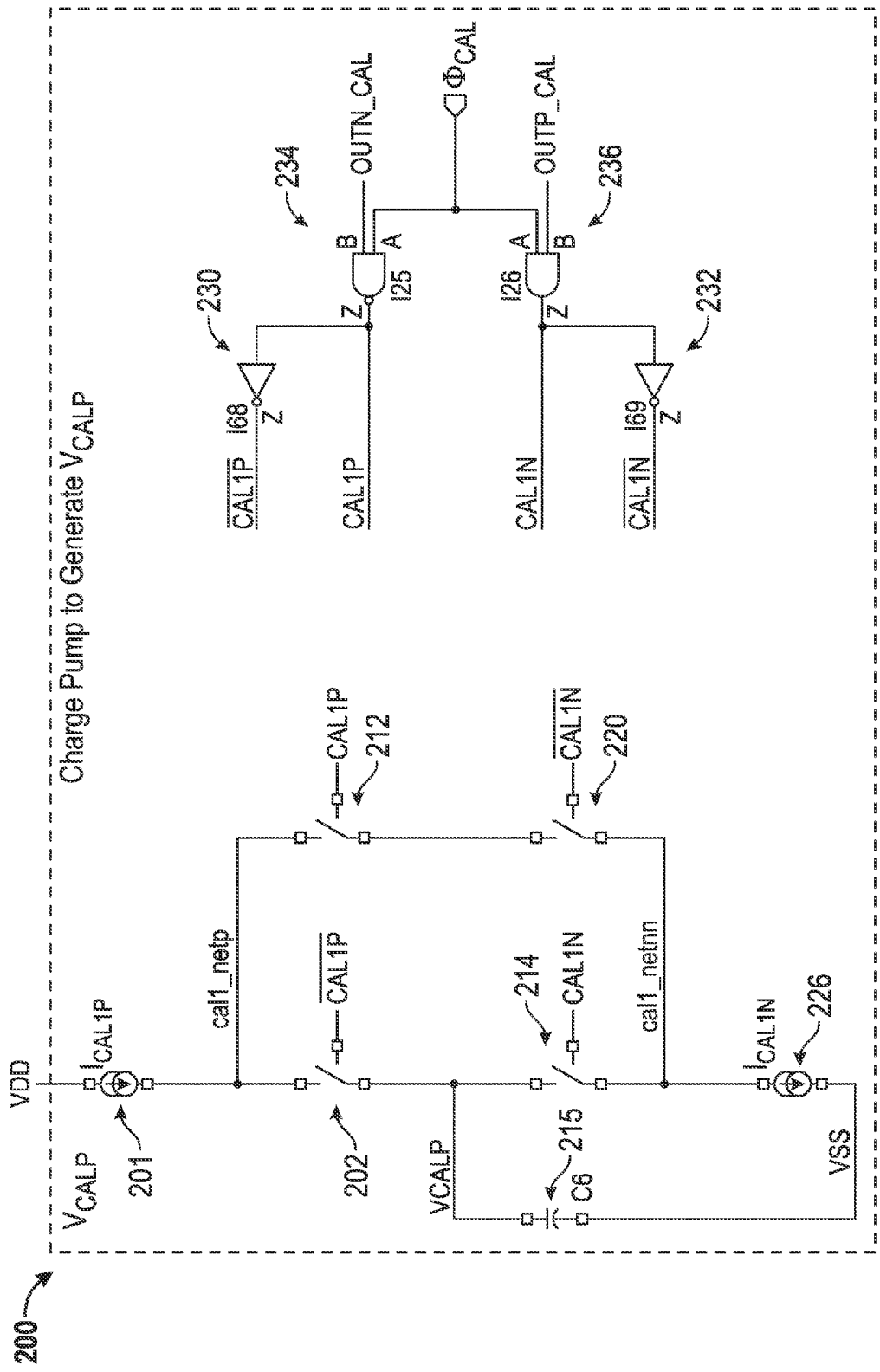
FIG. 1D illustrates a charge pump that forms a part of a continuously self-calibrated comparator, in accordance with the disclosed embodiments.

FIG. 1D illustrates a charge pump 200 that forms a part of a continuously self-calibrated comparator, in accordance with the disclosed embodiments. The charge pump 200 generates a voltage $V_{CALP}$. In general, charge pump 200 includes a current source 201 (also labeled as $I_{CAL1P}$ in FIG. 1D) that is connected to the voltage VDD and to switches 202 and 212. The switch 212 is further connected to a switch 220, which in turn is connected to a switch 214 and a current source 226. The switch 202 is further connected to the switch 214 and to a capacitor 215 (also labeled as C6 in FIG. 1D) at a node VCALP (where the voltage $V_{CALP}$ can be found). The other node of the capacitor 215 is connected the current source 226 at a node or point VSS. Note that in FIG. 1D, the current source 226 is also shown as $I_{CAL1N}$.

The charge pump 200 further includes a NAND gate 234 and an AND gate 236. Inputs to AND gate 236 include PCAL and OUTP_CAL. Inputs to NAND gate 234 can include (although not necessary) OUTN_CAL at input B and $\Phi_{CAL}$ at input A. Similarly, $\Phi_{CAL}$ can be provided to input A of AND gate 236 and OUTP_CAL can be provided to input B of AND gate 236. The output from the NAND gate 234 can be provided to an inverter 230 (e.g., a NOT gate). Output from AND gate 236 can be provided to an inverter 232 (e.g., a NOT gate). The output from inverter 230 can be connected to switch 202. The output from inverter 232 can be connected to switch 220. The output from AND gate 236 can be connected to switch 214 and the output from NAND gate 234 can be connected to switch 212.

Figure 1E:
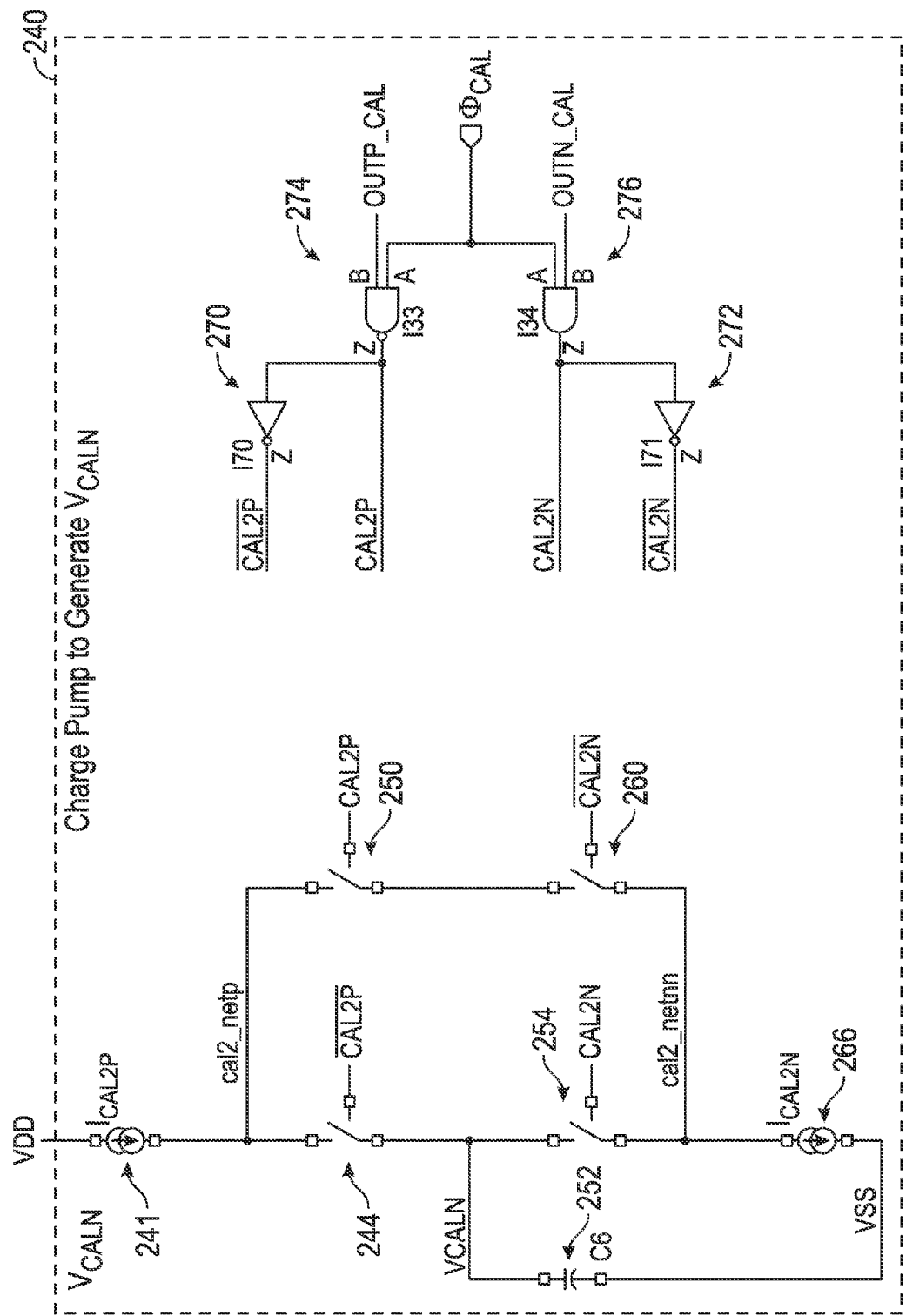
FIG. 1E illustrates another charge pump that forms a part of a continuously self-calibrated comparator, in accordance with the disclosed embodiments.

FIG. 1E illustrates another charge pump 240 that forms a part of a continuously self-calibrated comparator, in accordance with the disclosed embodiments. The charge pump 240 generates a voltage $V_{CALN}$. In general, the charge pump 240 includes a current source 241 that connect to a switch 244 and a switch 250. The switch 244 is connected to a switch 254 and a capacitor 252 (also labeled C6 in FIG. 1E) at a node VCALN (where the voltage $V_{CALN}$ can be found). The switch 254 is connected to another switch 260 and a current source 266.

The charge pump 240 can further include a NAND gate 274 that receives at one input OUTP_CAL at an input B and $\Phi_{CAL}$ at an input A. The output from the NAND gate 274 can be fed to a NOT gate or inverter 270 that has an output that can be connected to switch 244. The output from the NAND gate 274 can be connected to switch 250. Charge pump 240 further includes an AND gate 276. $\Phi_{CAL}$ and OUTN_CAL can be input to the AND gate 276 at respective inputs A and B. The output of the AND gate 276 can be further connected to a NOT gate or inverter 272. Output from the inverter 272 can be connected to the switch 260. Output from the AND gate 276 can also be connected to the switch 254.

FIGS. 1A to 1E thus present the complete schematic of an embodiment of the self-calibrated comparator 100. The major areas of the comparator are the input sampling networks 152 and 168, the dynamic preamplifier 120, the cross-coupled latch circuit 102, the delay latch 182, and the two charge pumps 200 and 240.

The operation of the comparator can be described as follows. First, $\Phi_1$ and $\Phi_2$ are two non-overlapping docks. $\Phi_1$ can be considered the comparison phase and $\Phi_2$ can be considered the reset phase. When $\Phi_2$ goes high, the same reference voltage (e.g., usually the common-mode voltage $V_{CM}$) can be applied to the gates of the comparator's input transistors. At the end of $\Phi_2$, the comparator is enabled by sending $\Phi_{LATCH}$ high. The comparator now decides which input has the greater voltage, inclusive of the comparator's offset. This decision is available when $\Phi_1$ goes high and is stored in the delay latch at the nodes OUTP_CAL and OUTN_CAL when $\Phi_2$ next goes high. Note that the charge pump operation during this cycle is discussed later. In addition, when $\Phi_2$ is high, the input capacitors C01 and C02 are charged to the difference of the reference voltages. If the reference voltages $V_{REFP}$ and $V_{REFM}$ are applied at the inputs VRP and VRM, then the capacitors C01 and C02 are charged to $V_{REFM}-V_{CM}$ and $V_{REFP}-V_{CM}$ respectively.

When $\Phi_1$ goes high, the input signals are applied to the comparator. For reference, the positive input signal $V_{INP}$ is applied to VIP and the negative input $V_{INM}$ signal is applied to VIM. At the end of $\Phi_1$, the comparator is enabled by sending $\Phi_{LATCH}$ high, and it makes a decision on comparing the input signals with the reference voltage. In other words, the comparator output OUTP goes high if $(V_{INP}-V_{INM})>(V_{REFP}-V_{REFM})$. This decision is available at OUTP and OUTN when $\Phi_2$ is high.

When $\Phi_2$ goes high, $V_{CM}$ is again applied to the gates of the comparator's input transistors. During this phase, both charge pumps become active and they charge or discharge $V_{CALP}$ and $V_{CALN}$ based on the comparator's outputs OUTP_CAL and OUTN_CAL after the last $\Phi_2$ comparison; this is the self-calibration action. For example, assume that the comparator's input referred offset is $V_{OS}$ and is represented as a voltage source applied to the gate of transistor 150. During $\Phi_2$, the comparator is comparing $V_{INP}+V_{OS}$ with $V_{INN}$, or rather, $V_{CM}+V_{OS}$ with $V_{CM}$, as $V_{CM}$ is applied to the gates of the comparator's input transistors. If $V_{OS}>0$, then the comparator's output shall be 1 at the end of the initial few $\Phi_1$ comparisons. Therefore, the calibration mechanism works such that $V_{CALN}>V_{CALP}$ so that more current can flow through the N-input transistors when the comparator is enabled. The cascode transistors 129 and 144 shown in FIG. 1B serve to isolate the nets T3 and T4 from the calibration voltages $V_{CALN}$ and $V_{CALP}$ respectively.

Thus, continuous self-calibration of a latched comparator can be implemented to reduce its input-referred offset. The approach depicted in FIGS. 1A-1E continuously calibrates the offset of the comparator 100 (i.e., the comparator 100 does not have to be taken offline during the calibration process). The calibration process does not interrupt or interfere with the operation of the ADC. In addition, since this calibration mechanism works continuously, it can detect drifts in the offset voltage due to changes in operating temperature or power supply and can calibrate them immediately.

Figure 2:
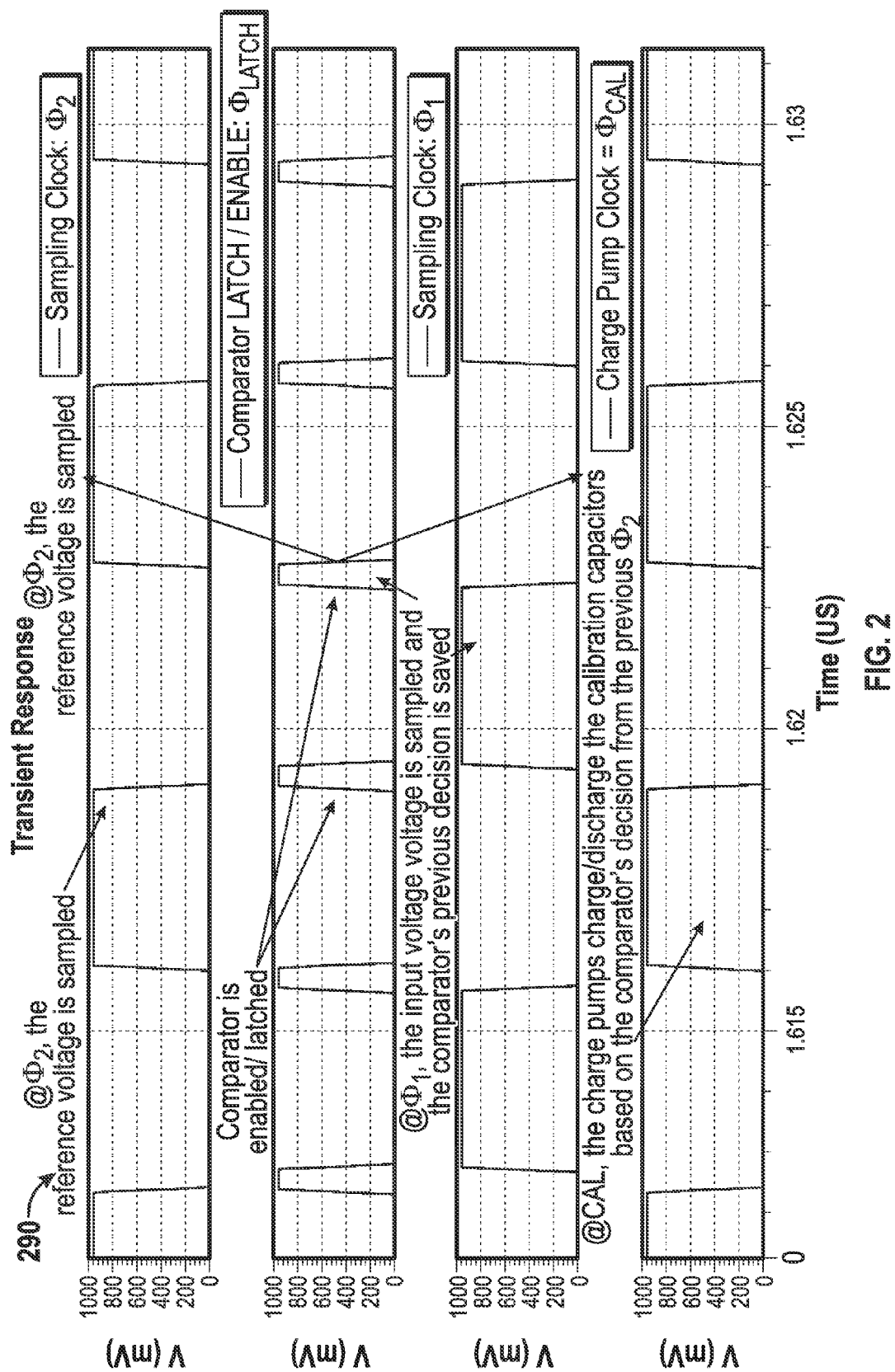
FIG. 2 illustrates a graph depicting clocking voltage/signals in a self calibrated comparator including transient response data thereof, in accordance with the disclosed embodiments.

FIG. 2 illustrates a graph 290 depicting clocking voltage/signals in the self-calibrated comparator 100, in accordance with the disclosed embodiments. FIG. 2 generally depicts the clocking and the sequences/actions of the comparator 100 that are described above. In graph 290 shown in FIG. 2, four types of data are depicted, including a sampling clock signal $\Phi_2$, comparator LATCH/ENABLE $\Phi_{LATCH}$, a sampling clock $\Phi_1$, and charge pump clock $\Phi_{CAL}$. In general, graph 290 tracks when the comparator is enabled/latched, when a reference voltage is sampled, and also when the input voltage is sampled and the comparator's previous decision is saved. The charge pump can charge/discharge the calibration capacitors based on the comparator's decision from the previous $\Phi_2$.

FIG. 3 illustrates a graph 300 depicting clocking voltage/signals in a sell-calibrated comparator including transient response data thereof, in accordance with the disclosed embodiments. FIG. 3 thus depicts simulated results of the self-calibrated comparator 100. In this example, an offset is externally applied by placing a voltage source at one of the input terminals of the comparator, and the comparator 100 is able to reduce this offset to significantly lower values. The effective input voltage due to the 10 mV offset=$V_{INP}-(V_{INN}-10$ mV$)=(V_{INP}-V_{INN})+10$ mV. Therefore, the calibration works to make $V_{CALN}$ greater than $V_{CALP}$ and, thereby, negate the effect of the applied offset voltage. In the example, the comparator's effective offset after calibration is ~0.43 mV and −0.36 mV (for the rising and falling input differential respectively). In other words, the 10 mV offset is reduced to less than 0.5 mV.

Based on the foregoing, it can be appreciated that a number of embodiments, preferred and alternative, are disclosed. For example, in a preferred embodiment, a comparator apparatus can be provided, which includes a preamplifier and one or more latched comparators connected to the preamplifier to compare input voltage signals to predefined reference voltage signals, wherein the latched comparator is responsive to an offset that limits the minimum input differential voltage signal with respect to the predefined voltage signals. The comparator apparatus can also include a calibration component electrically connected to the latched comparator(s) and the preamplifier, wherein the calibration component assists in measuring and compensating the offset in order to calibrate changes in the offset that arise due to electrical variations thereof.

In another embodiment, the calibration component can further assist in compensating the offset in order to continuously calibrate changes in the offset that arise to changes in the electrical variations thereof. In yet another embodiment, the latched comparator (or comparators) can include a delay latch that stores a decision output by the latched comparator (s). In still another embodiment, the delay latch can store the decision after sampling a common reference voltage and an input offset with respect to the input voltage signals during a reset phase of the latched comparator.

In another embodiment, the aforementioned decision can be employed in the calibration component for offset compensation during a next reset phase of the latched comparator. In another embodiment, the comparator apparatus can include at least two charge pumps that can be utilized to provide optimum calibration voltages with respect to the amplifier and a measured input offset. In yet another embodiment, the comparator apparatus can include at least one switching node and a cascode transistor that shields a calibration component voltage associated with the calibration component from the switching node(s).

In still another embodiment, a comparator apparatus can be configured, which includes a preamplifier and one or more latched comparators connected to the preamplifier to compare input voltage signals to predefined reference voltage signals, the latched comparator(s) responsive to an offset that limits the minimum input differential voltage signal with respect to the predefined voltage signals; and a calibration component electrically connected to the latched comparator(s) and the preamplifier, wherein the calibration component assists in measuring and compensating the offset in order to calibrate changes in the offset that arise due to electrical variations thereof, and wherein the calibration component further assists in compensating the offset in order to continuously calibrate changes in the offset that arise to changes in the electrical variations thereof.

In other embodiments, a method of measuring and compensating an offset utilizing a comparator apparatus can be implemented. Such a method can include the steps or logical operations of, for example, comparing input voltage signals to predefined reference voltage signals via a preamplifier connected to one or more latched comparators, the latched comparator responsive(s) to an offset that limits the minimum input differential voltage signal with respect to the predefined voltage signals; and measuring and compensating the offset in order to calibrate changes in the offset that arise due to electrical variations thereof via a calibration component electrically connected to the latched comparator(s) and the preamplifier.

It will be appreciated that variations of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art which are also intended to be encompassed by the following claims.

What is claimed is:

1. A comparator apparatus, comprising:
   a preamplifier and at least one latched comparator connected to said preamplifier to compare input voltage signals to predefined reference voltage signals, said at least one latched comparator responsive to an offset that limits the minimum input differential voltage signal with respect to said predefined voltage signals;
   a calibration component electrically connected to said at least one latched comparator and said preamplifier, wherein said calibration component assists in measuring and compensating said offset in order to calibrate changes in said offset that arise due to electrical variations thereof; and
   wherein said at least one latched comparator comprises a delay latch that stores a decision output by said at least one latched comparator, wherein said delay latch stores said decision after sampling a common reference voltage and an input offset with respect to said input voltage signals during a reset phase of said at least one latched comparator.

2. The apparatus of claim 1 wherein said calibration component further assists in compensating said offset in order to continuously calibrate changes in said offset that arise to changes in said electrical variations thereof.

3. The apparatus of dam 1 wherein said decision is utilized in said calibration component for offset compensation during a next reset phase of said at least one latched comparator.

4. The apparatus of claim 1 further comprising at least two charge pumps to provide optimum calibration voltages with respect to said amplifier and a measured input offset.

5. The apparatus of claim 1 further comprising:
   at least one switching node; and
   a cascode transistor that shields a calibration component voltage associated with said calibration component from said at least one switching node.

6. A comparator apparatus, comprising:
   a preamplifier and at least one latched comparator connected to said preamplifier to compare input voltage signals to predefined reference voltage signals, said at least one latched comparator responsive to an offset that limits the minimum input differential voltage signal with respect to said predefined voltage signals;
   a calibration component electrically connected to said at least one latched comparator and said preamplifier, wherein said calibration component assists in measuring and compensating said offset in order to calibrate changes in said offset that arise due to electrical variations thereof, and wherein said calibration component further assists in compensating said offset in order to continuously calibrate changes in said offset that arise to changes in said electrical variations thereof;
   said at least one latched comparator comprises a delay latch that stores a decision output by said at least one latched comparator;
   said delay latch stores said decision after sampling a common reference voltage and an input offset with respect to said input voltage signals during a reset phase of said at least one latched comparator; and
   said decision is utilized in said calibration component for offset compensation during a next reset phase of said at least one latched cormparator.

7. The apparatus of claim 6 wherein said at least one latched comparator comprises a delay latch that stores a decision output by said at least one latched comparator.

8. The apparatus of claim 7 wherein said delay latch stores said decision after sampling a common reference voltage and an input offset with respect to said input voltage signals during a reset phase of said at least one latched comparator.

9. The apparatus of claim 7 wherein said decision is utilized in said calibration component for offset compensation during a next reset phase of said at least one latched comparator.

10. The apparatus of claim 6 further comprising at least two charge pumps to provide optimum calibration voltages with respect to said amplifier and a measured input offset.

11. The apparatus of claim 6 further comprising:
    at least one switching node; and
    a cascode transistor that shields a calibration component voltage associated with said calibration component from said at least one switching node.

12. The apparatus of claim 6 further comprising at least two charge pumps to provide optimum calibration voltages with respect to said amplifier and a measured input offset.

13. The apparatus of claim 6 further comprising:
    at least one switching node; and
    a cascade transistor that shields a calibration component voltage associated with said calibration component from said at least one switching node.

14. A method of measuring and compensating an offset utilizing a comparator apparatus, said method comprising:
    comparing input voltage signals to predefined reference voltage signals via a preamplifier connected to at least one latched comparator, said at least one latched comparator responsive to an offset that limits the minimum input differential voltage signal with respect to said predefined voltage signals; and
    measuring and compensating said offset in order to calibrate changes in said offset that arise due to electrical variations thereof via a calibration component electrically connected to said at least one latched comparator and said preamplifier;

a delay latch stores said decision after sampling a common reference voltage and an input offset with respect to said input voltage signals during a reset phase of said at least one latched comparator; and said decision is utilized in said calibration component for offset compensation during a next reset phase of said at least one latched comparator.

15. The method of claim 14 wherein said calibration component further assists in compensating said offset in order to continuously calibrate changes in said offset that arise to changes in said electrical variations thereof.

16. The method of claim 14 wherein said at least one latched comparator further comprises said delay latch, wherein said delay latch that stores a decision output by said at least one latched comparator.

\* \* \* \* \*